(12) United States Patent
Enkisch et al.

(10) Patent No.: US 7,672,044 B2
(45) Date of Patent: Mar. 2, 2010

(54) LENS MADE OF A CRYSTALLINE MATERIAL

(75) Inventors: Birgit Enkisch, Aalen (DE); Hartmut Enkisch, Aalen (DE); Toralf Gruner, Aalen-Hofen (GB)

(73) Assignee: Carl Zeiss SMT AG, Oberkochen (DE)

( * ) Notice: Subject to any disclaimer, the term of this patent is extended or adjusted under 35 U.S.C. 154(b) by 327 days.

(21) Appl. No.: 11/864,193

(22) Filed: Sep. 28, 2007

(65) Prior Publication Data

US 2008/0019013 A1 Jan. 24, 2008

Related U.S. Application Data

(60) Division of application No. 10/983,569, filed on Nov. 8, 2004, now Pat. No. 7,292,388, which is a continuation of application No. PCT/EP02/12690, filed on Nov. 13, 2002, and a continuation-in-part of application No. 10/367,989, filed on Feb. 12, 2003, now Pat. No. 7,145,720, which is a continuation of application No. PCT/EP02/05050, filed on May 8, 2002.

(51) Int. Cl.
*G02B 13/14* (2006.01)
(52) U.S. Cl. .................. 359/355; 359/819; 356/138; 356/620; 65/29.12
(58) Field of Classification Search ............... None
See application file for complete search history.

(56) References Cited

U.S. PATENT DOCUMENTS 1,332,410 A 3/1920 Potts
2,033,101 A 3/1936 Tillyer et al.
5,652,745 A 7/1997 Noguchi et al.

(Continued)

FOREIGN PATENT DOCUMENTS

DE 4022904 1/1992

(Continued)

OTHER PUBLICATIONS

Burnett, J. H. et al., "Intrinsic Birefringence in 157nm Materials" Proceedings of the International Symposium on 157nm Lithography, Dana Point, California, May 15, 2001_ pp. 1-13.

(Continued)

*Primary Examiner*—Stephone B Allen
*Assistant Examiner*—Derek S Chapel
(74) *Attorney, Agent, or Firm*—Fish & Richardson P.C.

(57) ABSTRACT

As a preliminary stage in manufacturing a lens or lens part for an objective, in particular a projection objective for a microlithography projection system, an optical blank is made from a crystal material. As a first step in manufacturing the optical blank, one determines the orientation of a first crystallographic direction that is defined in the crystallographic structure of the material. The material is then machined into an optical blank so that the first crystallographic direction is substantially perpendicular to an optical blank surface of the optical blank. Subsequently, a marking is applied to the optical blank or to a mounting element of the optical blank. The marking has a defined relationship to a second crystallographic direction which is oriented at a non-zero angle relative to the first crystallographic direction.

20 Claims, 6 Drawing Sheets

U.S. PATENT DOCUMENTS

| | | |
|---|---|---|
| 6,201,634 B1 | 3/2001 | Sakuma et al. |
| 6,324,003 B1 | 11/2001 | Martin |
| 6,683,710 B2 | 1/2004 | Hoffman et al. |
| 6,765,717 B2 | 7/2004 | Allan et al. |
| 6,775,063 B2 | 8/2004 | Shiraishi |
| 6,782,074 B2 | 8/2004 | Sakuma |
| 6,782,075 B2 | 8/2004 | Pell |
| 6,788,389 B2 | 9/2004 | Fujishima et al. |
| 2003/0000453 A1 | 1/2003 | Unno et al. |
| 2003/0011893 A1 | 1/2003 | Shiraishi et al. |
| 2003/0012724 A1 | 1/2003 | Burnett et al. |
| 2003/0021026 A1 | 1/2003 | Allan et al. |
| 2003/0025894 A1 | 2/2003 | Owa et al. |
| 2003/0053036 A1 | 3/2003 | Fujishima et al. |
| 2003/0058421 A1 | 3/2003 | Omura et al. |
| 2003/0086071 A1 | 5/2003 | McGuire, Jr. |
| 2003/0086156 A1 | 5/2003 | McGuire, Jr. |
| 2003/0086157 A1 | 5/2003 | McGuire, Jr. |
| 2003/0086171 A1 | 5/2003 | McGuire |
| 2003/0099047 A1 | 5/2003 | Hoffman et al. |
| 2003/0168597 A1 | 9/2003 | Webb et al. |
| 2003/0197946 A1 | 10/2003 | Omura |
| 2003/0234981 A1 | 12/2003 | Hoffman et al. |
| 2004/0001244 A1 | 1/2004 | Hoffman et al. |
| 2004/0008348 A1 | 1/2004 | Kishikawa et al. |
| 2004/0036961 A1 | 2/2004 | McGuire, Jr. |
| 2004/0036971 A1 | 2/2004 | McGuire, Jr. |
| 2004/0036985 A1 | 2/2004 | McGuire, Jr. |
| 2004/0050318 A1 | 3/2004 | Sakai |
| 2004/0089023 A1 | 5/2004 | Hiraiwa et al. |
| 2004/0136084 A1 | 7/2004 | Unno et al. |
| 2004/0145806 A1 | 7/2004 | McGuire, Jr. et al. |
| 2004/0156051 A1 | 8/2004 | Takeuchi et al. |

FOREIGN PATENT DOCUMENTS

| | | |
|---|---|---|
| DE | 19807120 | 8/1999 |
| EP | 0103485 | 3/1984 |
| EP | 0857985 | 8/1998 |
| EP | 1063551 | 12/2000 |
| JP | 09166710 | 6/1997 |
| JP | 11-106296 | 4/1999 |
| JP | 2000331927 | 11/2000 |
| JP | 2001108801 | 4/2001 |
| WO | WO91/14189 | 9/1991 |
| WO | WO00/70407 | 11/2000 |
| WO | WO01/01182 | 1/2001 |
| WO | WO01/50171 | 7/2001 |
| WO | WO02/093201 | 11/2002 |
| WO | WO02/093209 | 11/2002 |
| WO | WO02/097508 | 12/2002 |
| WO | WO02/099500 | 12/2002 |
| WO | WO03/003072 | 1/2003 |
| WO | WO03/003429 | 1/2003 |
| WO | WO03/007045 | 1/2003 |
| WO | WO03/009017 | 1/2003 |
| WO | WO03/023481 | 3/2003 |
| WO | WO03/038479 | 5/2003 |
| WO | WO03/046634 | 6/2003 |
| WO | WO2004/019077 | 3/2004 |

OTHER PUBLICATIONS

Burnett J. H., et al. "Intrinsic birefringence in calcium fluoride and barium fluoride". Physical Review B (Condensed Matter and Materials Physics), American Institute of Physics. New York, US. Dec. 15, 2001, APS through AIP, US, vol. 64, Nr. 24, 241102/1-4.

Burnett, J. H. et al., "Intrinsic Birefringence in calcium fluoride" Preprint handed out at $2^{nd}$ International Symposium on 157nm Lithography in Dana Point, California, May 15, 2001.

Mulkens, J. et al. "157-nm technology: Where are we today?" Optical Microlithography XV. 2002. vol. 4691, 613-625. Proceedings of the SPIE-Int. Soc. Opt. Eng., Santa Clara, CA, US, Mar. 5-8, 2002.

Van Peski; Memo to PAG Members; "Re: Birefringence of calcium fluoride" written May 7, 2001 Nicht-Vertrauliches Schreiben vom May 7, 2001 "Re: Birefringence of calcium fluoride" van Chris VanPeski von International SEMATECH zu den Vertretern von Litho. PAG (Project Advisory Group).

Nogawa H., et al. "System design of a 157 nm scanner". Optical Microlithography XV. 2002. vol. 4691, 602-612 Proceedings of the SPIE-Int. Soc. Opt. Eng., Santa Clara, CA, US, Mar. 5-8, 2002.

Pastrnak, J. et al. "Optical anisotropy of silicon single crystals" Physical Review B (Solid State), Apr. 15, 1971 US vol. 3, No. 8, pp. 2567-2571.

Shiraishi, N. et al. "Progress of Nikon's F2 Exposure Tool Development". Proceedings of the SPIE, SPIE, Bellingham, VA, US Mar. 5, 2002 vol. 4691. Mar. 5, 2002. 594-601.

Burnett et al, "Symmetry of Spatial-Dispersion-Induced Birefringence and its Implications for CaF2 Ultraviolet Optics", J. Microlith., Microfab., Micro Syst., vol. 1, No. 3, Oct. 2002; pp. 213-224.

Burnett et al., "Preliminary Determination of an Intrinsic Birefringence in $CaF_2$", dated May 7, 2001, $2^{nd}$ International Symposium on 157nm Lithography in Dana Point, California, May 15, 2001.

Van Peski, Chris. "Birefringence of Calcium Fluoride", memo to Exposure Tool Manufactures and Lens Designers, dated May 7, 2001.

Wikipedia, X-Ray Crystallography, http://en.wikipedia.org/wiki/x-ray_crystallography, retrieved Jan. 22, 2007, pp. 1-4.

LENS MADE OF A CRYSTALLINE MATERIAL

CROSS-REFERENCE TO RELATED APPLICATION

This application is a divisional application of U.S. patent application Ser. No. 10/983,569, entitled "Lens Made of a Crystalline Material," filed on Nov. 8, 2004, which is a continuation of International Patent Application Serial No. PCT/EP02/12690 filed Nov. 13, 2002, and is a Continuation-in-Part of patent application Ser. No. 10/367,989, filed on Feb. 12, 2003, which, in turn, is a continuation of International Patent Application Serial No. PCT/EP02/05050 filed May 8, 2002, all of which are hereby incorporated herein by reference in their entirety.

BACKGROUND OF THE INVENTION

The present invention relates to a method of producing an optical blank from a crystalline material, as well as to an optical blank. The optical blank serves as a preliminary stage in the production of a lens or a lens part. Consequently, the invention also relates to a method of producing a lens or a lens part from a crystalline material, as well as to a lens or lens part. Lenses or lens parts of the kind that the invention relates to are used in optical objectives, specifically in projection objectives for a microlithography projection system. Consequently, the invention also relates to objectives, specifically projection objectives for a microlithography projection system.

Methods for producing an optical blank from a fluoride crystal material have been disclosed in U.S. Pat. No. 6,201,634. The optical blank is used to make lenses for a projection objective for a microlithography projection system. The lens axes of the lenses are oriented with preference in the crystallographic <111>-direction. According to U.S. Pat. No. 6,201,634, the crystallographic <111>-direction is selected for the purpose of minimizing the detrimental effects of stress-induced birefringence.

It is a general trait of birefringent lenses that a non-polarized light ray is split into two rays with, respectively, different states of polarization, different speeds of propagation, and different directions. When used in an objective, birefringent lenses will cause a loss in optical resolution unless appropriate corrective measures are taken. The birefringent effect in lenses can be caused, for example, by stress-induced birefringence that occurs as a result of the manufacturing process or as a result of mechanical forces acting on the lens. The phenomenon of birefringence is of particular importance in crystal optics. Anisotropic crystals are birefringent. However, isotropic crystals, too, such as the cubic fluoride crystals, exhibit an intrinsic birefringence, which becomes particularly noticeable at wavelengths in the far ultraviolet range (<200 nm). Cubic fluoride crystals such as calcium fluoride and barium fluoride are preferred lens materials for projection objectives with a working wavelength in this range. Consequently, in view of its detrimental effect at wavelengths in the far ultraviolet range, the intrinsic birefringence of these crystals needs to be compensated by appropriate measures.

In the present context, it is essential to have a clear system of notations for the crystallographic directions. Following are the notations by which crystallographic directions, crystallographic planes, and lenses whose lens axes are aligned in a specific crystallographic direction will hereinafter be characterized.

The indices for the crystallographic directions will hereinafter be bracketed between the symbols "<" and ">", and the indices for the crystallographic planes will be bracketed between the symbols "{" and "}". The crystallographic directions are perpendicular to the correspondingly indexed crystallographic planes. For example, the crystallographic direction <100> is perpendicular to the crystallographic plane {100}. Crystals with a cubic lattice structure, which includes the fluoride crystals that are of interest in the present context, have the principal crystallographic directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, <0$\bar{1}\bar{1}$>, <111>, <$\bar{1}$11>, <$\bar{1}\bar{1}$1>, <$\bar{1}$1$\bar{1}$>, <1$\bar{1}$1>, <$\bar{1}$11>, <1$\bar{1}$1>, <11$\bar{1}$>, <100>, <010>, <001>, <$\bar{1}$00>, <0$\bar{1}$0>, and <00$\bar{1}$>.

Because of the symmetries of cubic crystals, the principal crystallographic directions <100>, <010>, <001>, <$\bar{1}$00>, <0$\bar{1}$0>, and <00$\bar{1}$> are equivalent to each other. Therefore, those crystallographic directions that are oriented along one of the principal directions <100>, <010>, <001>, <$\bar{1}$00>, <0$\bar{1}$0>, and <00$\bar{1}$> will hereinafter be identified by the prefix "(100)-", and crystallographic planes that are perpendicular to these directions will also be identified by the same prefix "(100)-".

Furthermore, the principal directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, and <0$\bar{1}\bar{1}$> are likewise equivalent to each other. Therefore, those crystallographic directions that are oriented along one of the latter group of principal directions will hereinafter be identified by the prefix "(110)-", and crystallographic planes that are perpendicular to these directions will also be identified by the same prefix "(110)-".

Finally, the principal directions <111>, <$\bar{1}\bar{1}\bar{1}$>, <$\bar{1}$1$\bar{1}$>, <$\bar{1}$1$\bar{1}$>, <1$\bar{1}\bar{1}$>, <$\bar{1}$11>, <1$\bar{1}$1>, <11$\bar{1}$ > are likewise equivalent to each other. Therefore, those crystallographic directions that are oriented along one of the latter group of principal directions will hereinafter be identified by the prefix "(111)-", and crystallographic planes that are perpendicular to these directions will also be identified by the same prefix "(111)-".

Any statements made hereinafter in regard to one of the aforementioned principal crystallographic directions should be understood to be equally applicable to the equivalent principal crystallographic directions.

As is known from the article "Intrinsic Birefringence in Calcium Fluoride and Barium Fluoride" by J. Burnett et al. (Physical Review B, Volume 64 (2001), pp. 241102-1 to 241102-4), lenses made of calcium fluoride crystal material or barium fluoride crystal material exhibit intrinsic birefringence. The intrinsic birefringence is in this case strongly dependent on the material orientation of the fluoride crystal lens and on the light ray direction. The effect is maximal for a ray that passes through a lens along the crystallographic (110)-direction. The measurements presented by Burnett et al. demonstrate that a light ray traveling in the crystallographic (110)-direction of a calcium fluoride crystal is subject to a birefringence that amounts to 11.8±0.4 nm/cm at a wavelength of $\lambda$=156.1 nm, to 3.6±0.2 nm/cm at a wavelength of $\lambda$=193.09 nm, and to 0.55±0.07 nm/cm at a wavelength of $\lambda$=253.65 nm. On the other hand, with a light propagation in the <100> direction or in the <111> direction of the crystal, no intrinsic birefringence occurs in calcium fluoride, as is also predicted by theory. Thus, the intrinsic birefringence has a strong directional dependence and increases significantly for shorter wavelengths.

The directional dependence of the intrinsic birefringence in a fluoride crystal with a cubic crystal structure is shown in the published article "The trouble with calcium fluoride" by J. Burnett et al. (spie's oemagazine, March 2002, pp. 23-25 and FIG. 4), which may be accessed at "http://oemagazine.com/ fromTheMagazine/mar02/biref.html". The intrinsic birefringence of a light ray depends in this case on the aperture angle as well as on the azimuth angle of a light ray. As is made evident in FIG. 4, the intrinsic birefringence has a fourfold azimuthal symmetry if the lens axis is oriented in the crystallographic (100)-direction, a threefold azimuthal symmetry if the lens axis is oriented in the crystallographic (111)-direction, and a twofold azimuthal symmetry if the lens axis is oriented in the crystallographic (110)-direction. By rotating two fluoride crystal lenses relative to each other about their lens axes, it is possible to reduce the detrimental influence of the intrinsic birefringence. Favorable results are obtained with an angle of rotation of 45° for two lenses whose lens axes are oriented in the crystallographic (100)-direction, with an angle of rotation of 600 for two lenses whose lens axes are oriented in the crystallographic (111)-direction, and with an angle of rotation of 900 for two lenses whose lens axes are oriented in the crystallographic (110)-direction. By simultaneously using respective pairs of (100)-lenses, (111)-lenses, and (110)-lenses, it is possible to reduce the optical path difference between two mutually orthogonal states of polarization. As a further possibility, using calcium fluoride lenses and barium fluoride lenses in combination likewise results in a compensation of the detrimental influence of the intrinsic birefringence because, according to FIG. 2 of the same article, the respective birefringence effects for corresponding crystallographic directions in barium fluoride and calcium fluoride have opposite signs.

Projection objectives and microlithography projection systems have been disclosed, e.g., in the Patent Application Publication WO 01/50171 A1 (U.S. Ser. No. 10/177,580) and the references cited therein. The examples of embodiments presented in that patent application are purely refractive as well as catadioptric projection objectives with numerical aperture values of 0.8 and 0.9 at working wavelengths of 193 nm as well as 157 nm. The material used for the lenses is calcium fluoride.

The not pre-published patent application PCT/EP 02/05050 (U.S. Ser. No. 10/367,989) by the same applicant includes a description of different compensation methods for reducing the detrimental influence of the intrinsic birefringence, e.g., in the objectives that are presented as examples in WO 01/50171 A1 (U.S. Ser. No. 10/177,580). Among other possibilities, the solutions disclosed therein include the parallel use of (100)-lenses with (111)-lenses or (110)-lenses of the same fluoride crystal material as well as the use of compensation coatings. The disclosures of PCT/EP 02/05050 (U.S. Ser. No. 10/367,989) and of WO 01/50171 A1 (U.S. Ser. No. 10/177,580) are hereby incorporated herein in its entirety.

To conclude, the compensation methods described above for reducing the detrimental influence of the birefringence are based among other things on the use of lenses that are rotated relative to each other about their lens axes. The angle of rotation between two lenses depends for example on the crystallographic direction in which the lens axis is oriented. For example in lenses made by a method according to the previously cited reference U.S. Pat. No. 6,201,634, the lens axes are oriented in the crystallographic (111)-direction. Based on what has been said above, a favorable result in reducing the detrimental influence of the intrinsic birefringence is obtained in this case with an angle of rotation of 60° between two (111)-lenses. The angle of rotation is defined in relation to the crystallographic structures of the two lenses. However, the outward appearance of a lens gives no indication of its crystallographic structure.

OBJECT OF THE INVENTION

The invention therefore has the purpose to propose a method of producing optical blanks from a crystalline material as a preliminary stage for the production of lenses or lens parts, so that when the lenses and lens parts made from the blanks are subsequently installed in objectives, the method provides the capability to orient the lenses and lens parts with their crystal structures rotated by a given angle relative to each other.

SUMMARY OF THE INVENTION

To meet the purpose of the invention, i.e., to provide the capability of setting a predetermined angle of rotation in an optical objective between a crystallographically defined direction of a lens or lens part and a reference direction of the objective, or between respective crystallographically defined directions of two lenses or lens parts, it is of advantage if each lens or lens part or its lens mount carries a marking that stands in a defined relationship with the crystallographic structure of the lens or lens part.

The term "lens parts" refers for example to individual lenses which are seamlessly joined through the technique of wringing to form one single lens. In a general sense, lens parts are the components of a single lens.

Preferred crystals used as raw materials for the optical blanks are the cubic fluoride crystals which include, e.g., calcium fluoride, barium fluoride, or strontium fluoride.

A multitude of shaping and surface-finishing process steps are required to bring a lens or lens part into its final form. For lenses or lens parts that consist of a crystalline material, the raw material is normally a mono-crystalline block or a mono-crystalline ingot which can for example be produced through one of the methods described in the previously mentioned U.S. Pat. No. 6,201,634. Starting from the mono-crystalline block, one proceeds to produce an optical blank, for example by sawing or grinding. The term optical blank means a preliminary stage of a lens or lens part. One or more lenses or lens parts can be manufactured from the optical blank. If two or more lenses or lens parts are produced from one optical blank, the latter is carved up into individual optical blanks by sawing. In a next work phase, the individual optical blanks are ground and/or polished, so that measurements can be performed at the surfaces that have been prefinished in this manner. The optical blanks resulting from the foregoing process have the form of individual material disks of cylindrical shape.

It is advantageous if the optical blank has an optical blank surface whose normal vector is aligned in a first crystallographic direction that is defined within the crystallographic structure. As an advantageous choice, this first crystallographic direction is a principal crystallographic direction, for example the crystallographic <100>-, <111>-, or <110>-direction.

As a first step of the inventive method, it is therefore necessary to determine the orientation of the first crystallographic direction in the optical blank. This determination can be made on the optical blank before the latter is cut apart further into individual smaller optical blanks. It is likewise possible, to first cut apart the large blank and to make the determination on the individual smaller blanks.

As a second step of the method, the optical blank is shaped by sawing and grinding operations in such a manner that the first crystallographic direction is approximately perpendicular to the optical blank surface. The deviation between the first crystallographic direction and the normal vector of the optical blank surface is preferably smaller than 5°. The optical blank surface represents in this case the front or back of the material disk.

As a third step, a marking is applied to the optical blank or to its mounting element. The marking has a defined relationship to a second crystallographic direction that is oriented at a non-zero angle relative to the first crystallographic direction. The second crystallographic direction can likewise be a principal crystallographic direction, or it can be another direction that is defined within the crystallographic structure, for example the crystallographic <331>-direction or the crystallographic <511>-direction.

The marking can consist for example of a point- or line marking that is engraved on the cylindrical border surface of the blank or on the mounting element that is rigidly connected to the optical blank. The mounting element can consist of a metallic, ceramic, or glass-ceramic material.

The defined relationship between the second crystallographic direction and the marking can be established by defining the marking as an index mark to indicate a reference direction that is perpendicular to the first crystallographic direction and represents a projection of the second crystallographic direction into a plane whose normal vector is oriented along the first crystallographic direction. In a cylindrical optical blank with a symmetry axis pointing substantially in the first crystallographic direction, the reference direction is preferably defined by a radial line that intersects the symmetry axis. Thus, the marking indicates the intersection of the reference direction with the cylindrical outside border of the optical blank or with the mounting element. Accordingly, the marking also defines an azimuth angle of the projected second crystallographic direction in relation to a coordinate system that is connected to the optical blank. The azimuth angle is defined as the angle between the reference direction and a coordinate axis that is perpendicular to the symmetry axis and intersects the symmetry axis.

To determine the first crystallographic direction, the optical blank can be exposed to a test radiation, in particular an X-ray test radiation from a defined incident direction. The test radiation is reflected at the crystallographic planes that are associated with the first crystallographic direction, for example the crystallographic {111}-planes, whereby a Bragg reflex pattern is produced. Since the wavelength of the test radiation and the material of the optical blank are known, the theoretical angle of the incident and reflected test radiation relative to the first crystallographic direction is a known quantity determined by Bragg's law. To find the first crystallographic direction, one proceeds to make continuing adjustments to the position of the optical blank relative to the Bragg measurement apparatus until the Bragg reflex for the first crystallographic direction is detected. Based on the orientations of the measurement apparatus and the optical blank relative to each other, one determines the orientation of the first crystallographic direction relative to the normal vector of the optical blank surface of the optical blank. If the normal vector of the optical blank surface does not coincide with the first crystallographic direction, the optical blank is reworked, e.g., by grinding, until the angle deviation is less than ±5°.

In an advantageous embodiment, the optical blank is rotatably supported relative to an axis that is perpendicular to the optical blank surface of the optical blank. With this arrangement, the Bragg reflexes are determined for different angles of rotation, in the simplest case at 0° and 90°.

The reference direction can likewise be determined by analyzing a Bragg reflex. In this case, the test radiation is reflected at the crystallographic planes that are associated with the second crystallographic direction.

Alternatively, the orientation of the reference direction can be determined through the Laue method.

It is of advantage to set a rule for selecting the reference direction so that the birefringence will cause, e.g., a maximum of the optical path difference for two mutually orthogonal states of linear polarization in a light ray traversing the lens, if the projection of the light ray into a plane that is perpendicular to the first crystallographic direction runs parallel to the reference direction. If the compensation methods of the foregoing description are used, i.e., the concept of rotating lenses relative to each other, the prescribed angles of rotation can easily be set based on this rule for selecting and marking the reference direction. It is also possible to adopt the rule for selecting and marking the reference direction so that the optical path difference takes on a minimum value in a light ray traversing the lens if the projection of the light ray into a plane that is perpendicular to the first crystallographic direction runs parallel to the reference direction.

If the first crystallographic direction runs in the <100>-direction or in the <111>-direction or a direction that is equivalent to either of these crystallographic directions, it is advantageous if the projection of the second crystallographic direction into a plane that is orthogonal to the first crystallographic direction runs parallel to the projection of the <110>-direction or a <110>-equivalent direction into the same plane. What makes this choice of orientation advantageous is the fact that the optical path difference is maximal for light rays that run parallel to the <110>-direction or a <110>-equivalent direction.

If the first crystallographic direction is oriented in the <111>-direction or a <111>-equivalent crystallographic direction, it is advantageous if the second crystallographic direction is oriented in the <331>-direction or a <331>-equivalent crystallographic direction.

If the first crystallographic direction is oriented in the <100>-direction or a <100>-equivalent crystallographic direction, it is advantageous if the second crystallographic direction is oriented in the <511>-direction or a <511>-equivalent crystallographic direction.

Because the test radiation that is used for the determination of the Bragg reflexes can damage the material at the optical blank surfaces, it is advantageous if the parts of the optical blank that have been traversed by the test radiation are removed by grinding or polishing.

The foregoing method is advantageously used to produce an optical blank as the initial product stage from which a lens or a lens part for an objective is manufactured.

In the production of a lens or lens part from a blank that has been prepared according to the foregoing description, the optical surfaces of the lens or lens part are machined in such a way that the lens axis ends up aligned approximately parallel to the first crystallographic axis, i.e., approximately parallel to the normal vector of the optical blank surface. The deviation between the first crystallographic direction and the lens axis should preferably be less than ±5°. The curved lens surfaces of the lens are produced by grinding and polishing the optical surfaces of the optical blank. If the lens surfaces are rotationally symmetric, the lens axis is represented by the symmetry axis. If the lens surfaces are not rotationally symmetric, the lens axis can be represented by the central ray of an incident bundle of light rays or by a straight line in relation to which the ray angles of all light rays inside the lens take on minimal values. The term lens in this context includes for example refractive or diffractive lenses as well as correction plates with free-form corrective surfaces. Planar-parallel plates, too, are considered as lenses if they are arranged in the light path of an objective. The lens axis of a planar-parallel plate is in this case perpendicular to the planar lens surfaces.

If the marking of the reference direction that has been applied to the optical blank is obliterated by the subsequent manufacturing process of the lens or lens part, it is important to transfer the marking of the reference direction to the lens or lens part or to its mounting element.

In lenses or lens parts that are used in high-performance optical systems such as projection objectives for applications in microlithography, the angular deviation between the lens axis and the first crystallographic direction has an effect even if it is smaller than 5°. It is therefore advantageous to determine this angular deviation very accurately. This can be accomplished for example through X-ray diffractometry methods. It is further advantageous to know not only the magnitude of the angle, but also the orientation of the first crystallographic axis. The orientation can be described in terms of a directional vector of the angular deviation of the lens axis. The directional vector of the angular deviation is perpendicular to the lens axis and represents the projection of the first crystallographic direction into a plane that is perpendicular to the lens axis. The direction of the angular deviation of the lens axis is marked on the lens or lens part, for example on the border of the lens. Alternatively, the marking can also be applied to a mounting element of the lens or lens part. If the lens or lens part or its mounting element already carries a marking for the reference direction, it is also possible to determine the angle between the reference direction and the direction of the angular deviation, with a positive or negative sign indicating the sense of rotation, and to assign the result as a unit-specific value to the respective lens or lens part. For example, the value for this angle could be stored in a database in which the material data and manufacturing data for the lens or lens part are kept.

As an alternative, the marking for the second crystallographic direction can also be applied to the lens or lens part after the latter has been produced from an optical blank of a crystal material. The lens is made from a blank, e.g., by grinding and polishing of the lens surfaces. In this process, the surfaces are formed in such a manner that the lens axis ends up parallel to a first crystallographic direction that preferably coincides with a principal crystallographic direction. In a next step, the lens or lens part or its mounting element is marked with an index marking which has a defined relationship to a second crystallographic direction enclosing a non-zero angle with the first crystallographic direction. The second crystallographic direction can likewise coincide with a principal crystallographic direction, or it can be another crystallographic direction defined within the crystallographic structure, for example the crystallographic <331>-direction if the lens axis is oriented in the crystallographic <111>-direction, or the crystallographic <511>-direction if the lens axis is oriented in the crystallographic <100>-direction.

The marking can consist for example of a point- or line marking that is engraved on the cylindrical border surface of the lens or lens part or on the mounting element that is rigidly connected to the lens or lens part. The mounting element can consist of a metallic, ceramic, or glass-ceramic material.

The defined relationship between the second crystallographic direction and the marking can be established by defining the marking as an index mark to indicate a reference direction that is perpendicular to the first crystallographic direction and represents a projection of the second crystallographic direction into a plane whose normal vector is oriented in the direction of the lens axis. The reference direction is preferably defined by a radial line that intersects the lens axis. Thus, the marking indicates for example the intersection of the reference direction with the cylindrical outside border of the lens or lens part or with the mounting element. Accordingly, the marking also defines an azimuth angle of the projected second crystallographic direction in relation to a coordinate system that is connected to the lens or lens part.

The same methods as were proposed above for an optical blank can also be used for determining the reference direction in a lens or lens part. For the measurement of the Bragg reflex it is advantageous if the position of the lens is adjustable so that the test radiation meets the curved lens surface at a defined point of incidence. Particularly if measurements are made at different rotated positions of the lens, it is advantageous if the test radiation meets the lens in the area of the lens vertex.

In order to avoid self-shading in the case of concave lens surfaces, it is advantageous to select the second crystallographic direction in such a manner that the incident test radiation and the reflected radiation that is used for the determination of the first crystallographic direction and of the reference direction is not disturbed by the lens geometry.

Crystal materials that are advantageously used in objectives at short wavelengths of less than 200 nm are the cubic fluoride crystals such as calcium fluoride, barium fluoride, or strontium fluoride.

Only at wavelengths shorter than 200 nm does the intrinsic birefringence in cubic fluoride crystals manifest itself strongly enough to make appropriate corrective measures necessary. Therefore, the determination of the reference direction and the in some cases required determination of the direction of the angular deviation of the lens axis are of advantage primarily for applications involving wavelengths shorter than 200 nm. Lenses and lens parts that carry a marking of a reference direction and in some cases a direction of the angular deviation of the lens axis are used with preference for objectives in which the detrimental effect of birefringence is reduced by rotating the lenses in relation to each other. The marking which is correlated to the crystallographic orientation significantly simplifies the setting of a targeted angle of rotation between individual lenses. Based on the birefringent properties of fluoride crystals which follow theoretical prediction and based on the known methods of compensation, the angles of rotation between the individual lenses or lens parts of an objective can be determined so that the detrimental effects of birefringence on the imaging performance of an objective are significantly reduced.

It is particularly advantageous in the process of determining the angles of rotation, if the lens-specific values of the angle between the first crystallographic direction and the lens axis as well as the direction of the angular deviation of the lens axis are taken into account.

Determining and marking only the direction of the angular deviation is advantageous if the optical performance characteristics depend primarily on the angular deviation between the first crystallographic direction and the lens axis. Through an appropriate rotation of the lens about its lens axis by a predetermined amount, it is possible to achieve a corrective effect on the imaging properties of the objective by combining several lenses or lens parts that are rotated relative to each other. This allows lenses or lens parts to be used even if they have an angular deviation between the first crystallographic direction and the lens axis. The difficulties in the manufacture of lenses or lens parts of crystalline material are thereby alleviated to a considerable extent, since the production tolerances can be relaxed.

The objective in the aforementioned case can be a purely refractive projection objective consisting of a multitude of lenses arranged with rotational symmetry relative to the optical axis, or the objective can be a projection objective of the catadioptric type.

Projection objectives of this kind can be used advantageously in projection systems that include a light source, an illumination system, a mask-positioning system, a mask that carries a structure, a projection objective, a substrate-positioning system, and a light-sensitive substrate.

This microlithography projection system finds application in the manufacture of microstructured semiconductor elements.

BRIEF DESCRIPTION OF THE DRAWINGS

The invention will be explained hereinafter in more detail with reference to the drawings, wherein.

DETAILED DESCRIPTION OF PREFERRED EMBODIMENTS

As an example that embodies the invention, the following is a description of the manufacturing process of calcium fluoride lenses whose lens axes coincide substantially with the crystallographic <111>-direction. However, the methods described herein can also be applied to the manufacture of lenses of other crystalline materials with a cubic structure such as for example barium fluoride or strontium fluoride. Furthermore, the lens axes can also be aligned in the crystallographic <100>- or <110>-direction. The method is suitable for the manufacture of planar-parallel lenses as well as lenses or lens parts with curved surfaces.

Figure 1:
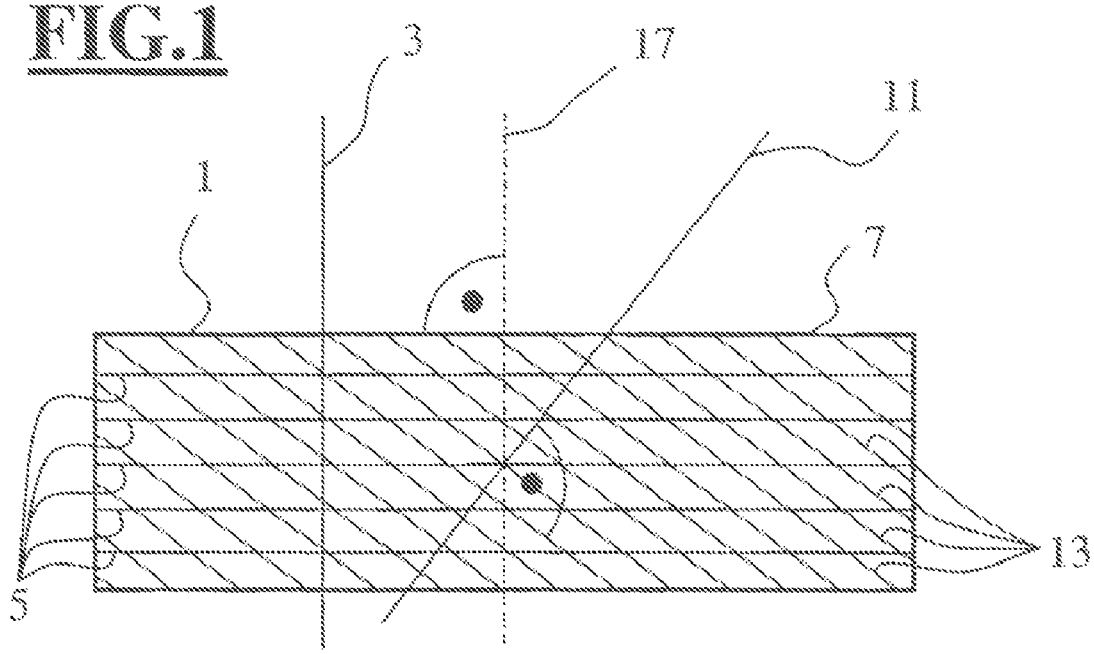
FIG. 1 schematically represents a cross-section of an optical blank.
Figure 2:
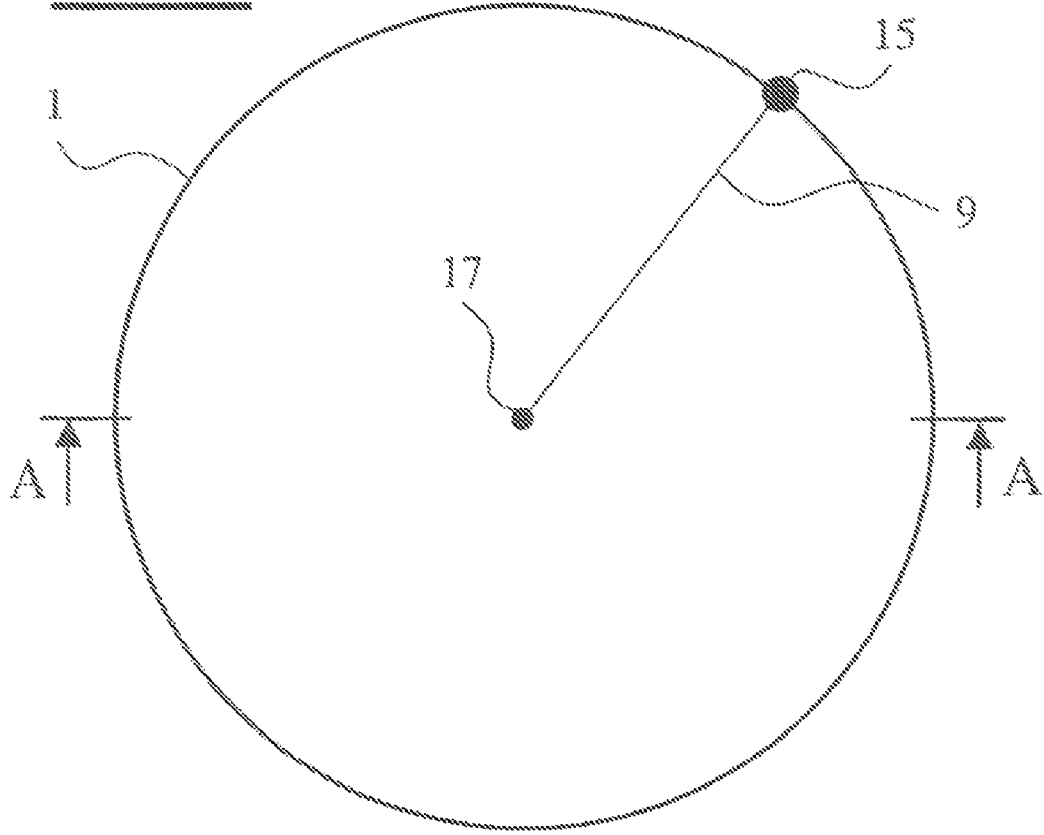
FIG. 2 schematically represents a plan view of the optical blank of FIG. 1.

In a preliminary stage of the manufacturing process of a lens, an optical blank is produced. FIGS. 1 and 2 schematically illustrate an optical blank 1 which was produced by the method according to the invention. FIG. 1 represents a cross-section of an optical blank 1 along the line A-A which is indicated in the plan view drawing of FIG. 2.

In a first step of the method, the orientation of the crystallographic <111>-direction 3 of the optical blank 1, in this case a calcium fluoride disk, is determined. The crystallographic <111>-direction 3 is perpendicular to the crystallographic {111}-planes 5, a few of which are indicated in FIG. 1. This determination can be made with a high degree of accuracy through crystallographic methods such as, e.g., by a determination of cleaving surfaces or by generating etching craters. Better results in the determination of crystallographic directions are obtained with X-ray diffractometry. A suitable instrument for this technique is a goniometer arrangement used with monochromatic X-rays. The occurrence of a Bragg reflex for the {111}-planes 5 is determined with the help of tabulated literature values. The tabulated values show the required angles of incidence for the different reflex indices. To perform the measurement, the calcium fluoride disk is rotated about an axis that is perpendicular to the calcium fluoride disk. As a result, one obtains the deviation of the <111>-direction from the normal vector of the calcium fluoride disk for different angles of rotation. It is advantageous if the deviation is determined for at least two rotary positions. In the present example, the measurements are made at 0° and 90°. Additional measurements can be performed at 180° and 270° or at further angles in between to enhance the measuring accuracy.

In a second step, the calcium fluoride disk is worked into a shape where the normal vector of the calcium fluoride disk is parallel to the crystallographic <111>-direction 3, so that the crystallographic <111>-direction 3 is substantially perpendicular to the optical blank surface 7. The deviation measured in the first step serves as a basis for a controlled correction, i.e., a specifically defined reshaping of the calcium fluoride disk by sawing or grinding. Following this processing step, the normal vector of the calcium fluoride disk is oriented in the crystallographic <111>-direction within a tolerance of less than 5°.

As a third step, a reference direction 9 is determined in the calcium fluoride disk, such that the reference direction has a defined relationship to a further crystallographic direction. If the normal vector of the calcium fluoride disk is oriented in the <111>-direction 3, it is advantageous if one of the three crystallographic directions <110>, <011> and <101> or one of the directions <100>, <010> and <001> is known, which are grouped in threefold symmetry relative to the <111>-direction. This is of interest because the intrinsic birefringence causes a maximum optical path difference in a light ray for two mutually orthogonal states of linear polarization, if the light ray travels in the <110>-direction or a <110>-equivalent direction in a calcium fluoride lens. No optical path difference occurs if the light ray travels in the <100>-direction or a <100>-equivalent direction. Each of the three crystallographic directions <110>, <011> and <101> is angled at 35° to the <111>-direction, and each of the directions <100>, <010> and <001> is angled at 55° to the <111>-direction. For reasons that have a physical explanation, the X-ray reflections of (110)- or (100)-planes are not measurable in crystals with a calcium fluoride structure. It is therefore necessary to use the Bragg reflexes of other crystallographic planes that have a defined relationship to the (100)- and (110)-planes. For example, it is possible to use a (331)-Bragg reflex. Each of the three crystallographic directions <331>, <133> and <313> runs at an angle of 22° to the <111>-direction. The crystallographic <331>-direction 11 is indicated in FIG. 1. It runs perpendicular to the crystallographic {331}-planes 13, some or which are indicated in the drawing. The (331) Bragg reflex for monochromatic copper Kα-radiation (8048 eV) in calcium fluoride is found at 38°. Thus, the reflex is found with an angle of incidence of 16° and a detector angle of 60° relative to the reference plane that is defined by the surface 7 of the calcium fluoride disk. In the course of a 360°-rotation of the disk about its normal vector axis, Bragg reflexes will be observed at three angular positions. Each of the Bragg reflexes indicates a position where one of the directional vectors of the three targeted (331)-planes lies in the plane of incidence of the Bragg measurement. The projections of the three (331)-directions onto the disk surface 7 are parallel to the projections of the three crystallographic directions <110>, <011> and <101>. Thus, by determining the crystallographic directions <331>, <133> and <313>, the directions of the projections of the <110>-, <011>- and <101>-directions are determined at the same time. If the normal vector of the disk surface deviates from the <111>-direction, the position settings for the source and the detector have to be adjusted accordingly.

The reference direction 9 in FIG. 2 is aligned with the projection of the crystallographic <331>-direction into a plane that is orthogonal to the crystallographic <111>-direction. The reference direction 9 is indicated by a radial line which intersects the symmetry axis 17 of the optical blank 1.

Alternatively, the crystallographic orientations can also be determined from a Laue pattern. In contrast to the measurements of Bragg reflexes of monochromatic X-ray light which have been described above, the Laue method works with "white" light, i.e., X-ray light with a broad band of wavelengths. With white X-ray light, one obtains Bragg reflexes of different families of crystallographic planes generating a Laue pattern that is characteristic for the material. If the <111>-direction is parallel to the direction of the incident light, a Laue pattern of threefold symmetry is produced. If the <111>-direction deviates by a few degrees from the normal vector of the disc, the pattern will be slightly distorted. The exact analysis of the Laue pattern, e.g. with an appropriate software program, can be used to determine the deviation of the <111>-direction from the normal vector of the disc. By evaluating the pattern, it is further possible to identify the triplets of crystallographic directions <110>, <011>, <101> or <100>, <010>, <001> and thereby determine the orientation of the disc.

In a fourth step, at least one marking 15 is applied to the optical blank 1 to indicate the reference direction 9. Thus, the marking 15 has a defined relationship to the crystallographic <331>-direction 11. The marking can be made, e.g., by engraving, etching, or with a writing instrument. The cylindrical border of the optical blank 1 suggests itself as a natural location for applying the marking. Alternatively, the marking can also be applied on a mounting element that has a fixed connection to the optical blank 1.

Figure 3:
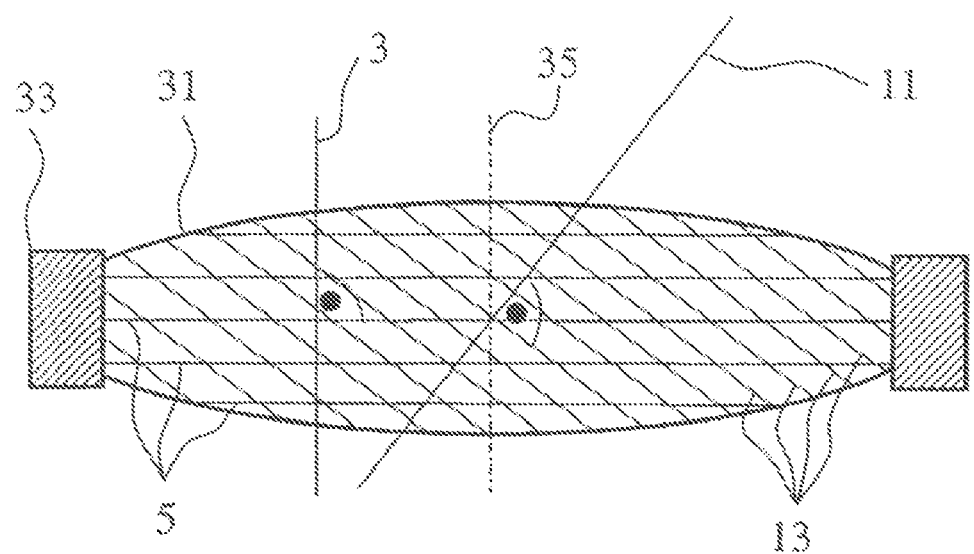
FIG. 3 schematically represents a cross-section of a lens held in a mounting element.
Figure 4:
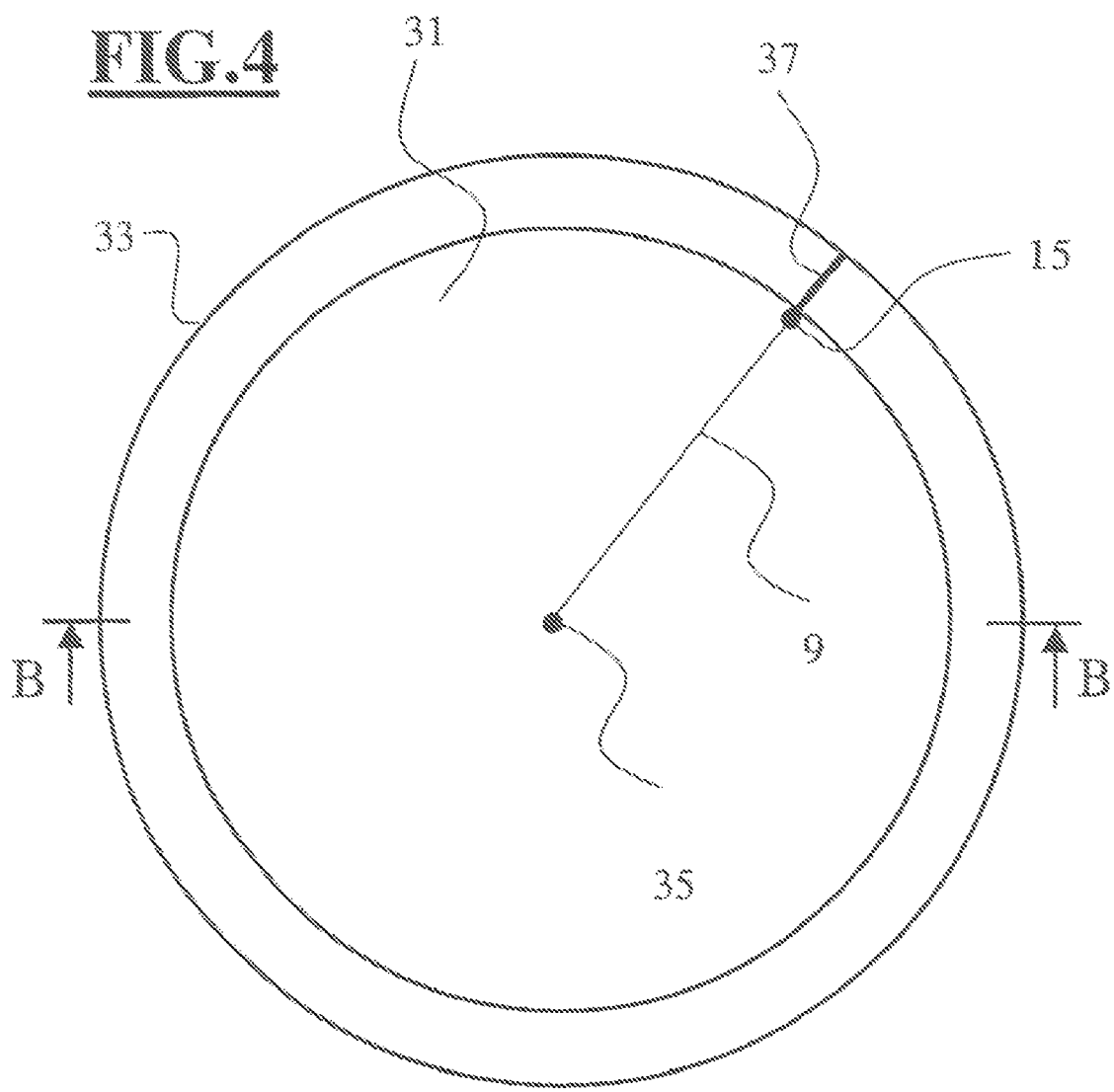
FIG. 4 schematically represents a plan view of the lens with the mounting element of FIG. 3.

In a fifth step, a lens is produced from the optical blank 1. FIGS. 3 and 4 schematically illustrate the lens 31 produced from the optical blank 1. The lens 31 is held in a mounting element 33. FIG. 3 shows the mounted lens 31 in a sectional view along the line B-B which is indicated in the plan view drawing of FIG. 4.

The lens 31 is made in such a way that the lens axis 35 ends up parallel to the <111>-direction of the crystal structure of the lens. This processing step does not destroy the marking 15 that was applied in the manufacturing process of the optical blank 1, because many machining operations such as grinding and polishing apply only to the top and bottom of the lens but not to the cylindrical circumference. However, if the circumference is to be machined also, for example in a turning operation, the marking will have to be transferred with sufficient accuracy to the mounting device of the calcium fluoride disc and reapplied to the cylindrical border after the machining operation has been completed.

An additional marking 37 for the reference direction 9 is applied to the mounting element 33.

In a further example, a lens is manufactured from an optical blank of cubic fluoride crystal material, for example calcium fluoride, where the blank has been manufactured in such a way that its crystallographic <111>-direction is already substantially perpendicular to the surface of the optical blank. In this case, the marking is applied only after the lens has been manufactured.

In a first step, the lens is made out of the optical blank in such a manner that the lens axis is oriented in the <111>-direction.

The reference direction is determined as a next-following step. The procedures used for this determination are the same as described above for the calcium fluoride disc. However, it is important to precisely adjust the height of the point of incidence of the X-ray on the lens surface. The support surface for the lens is therefore height-adjustable. This makes it possible to follow the curved profile of the lens if different points on the curved lens surface are to be measured. It further needs to be noted that the curvature can cause a shade-out of the incident or outgoing ray. Shade-outs can be avoided by selecting a suitable Bragg reflex in combination with the appropriate geometrical arrangement for the measurements.

In the case of planar-parallel plates, the foregoing procedure with a goniometer arrangement can be used at any point of the surface.

In the machining process of the optical blanks and lenses, it needs to be taken into account that the irradiation of calcium fluoride with X-rays can lead to the formation of color centers. The penetration depth of copper-K$\alpha$-radiation in calcium fluoride is approximately 30 µm. In order to avoid the possible existence of color centers in the material, it is advantageous if the X-ray analysis is performed only on calcium fluoride blanks or lenses in which a sufficient amount of surface material will be removed in subsequent processing steps. In the case of a Cu—K$\alpha$-irradiation, this means that the surface material should be removed to a depth of at least 30 µm.

Figure 5:
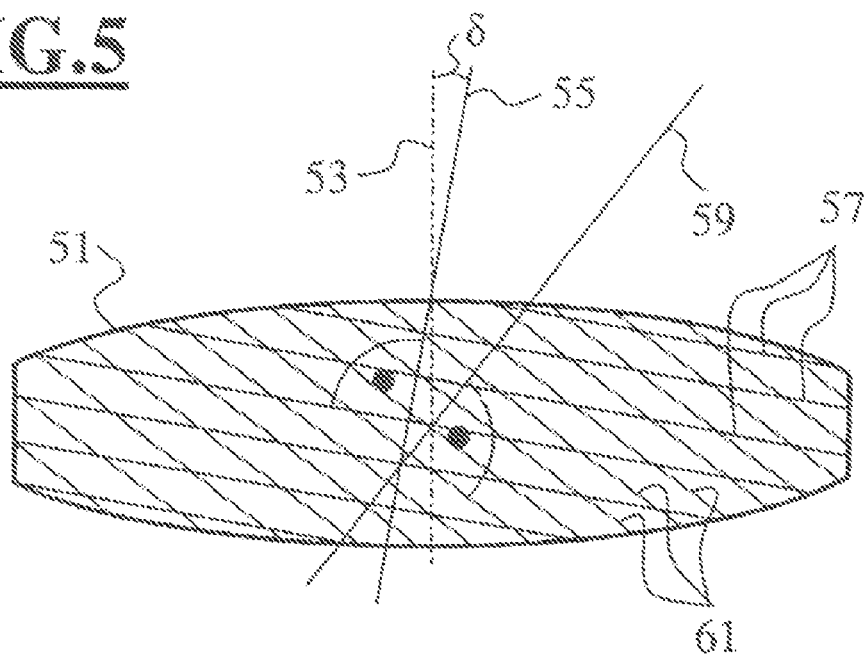
FIG. 5 schematically represents a cross-section of a further example of a lens.
Figure 6:
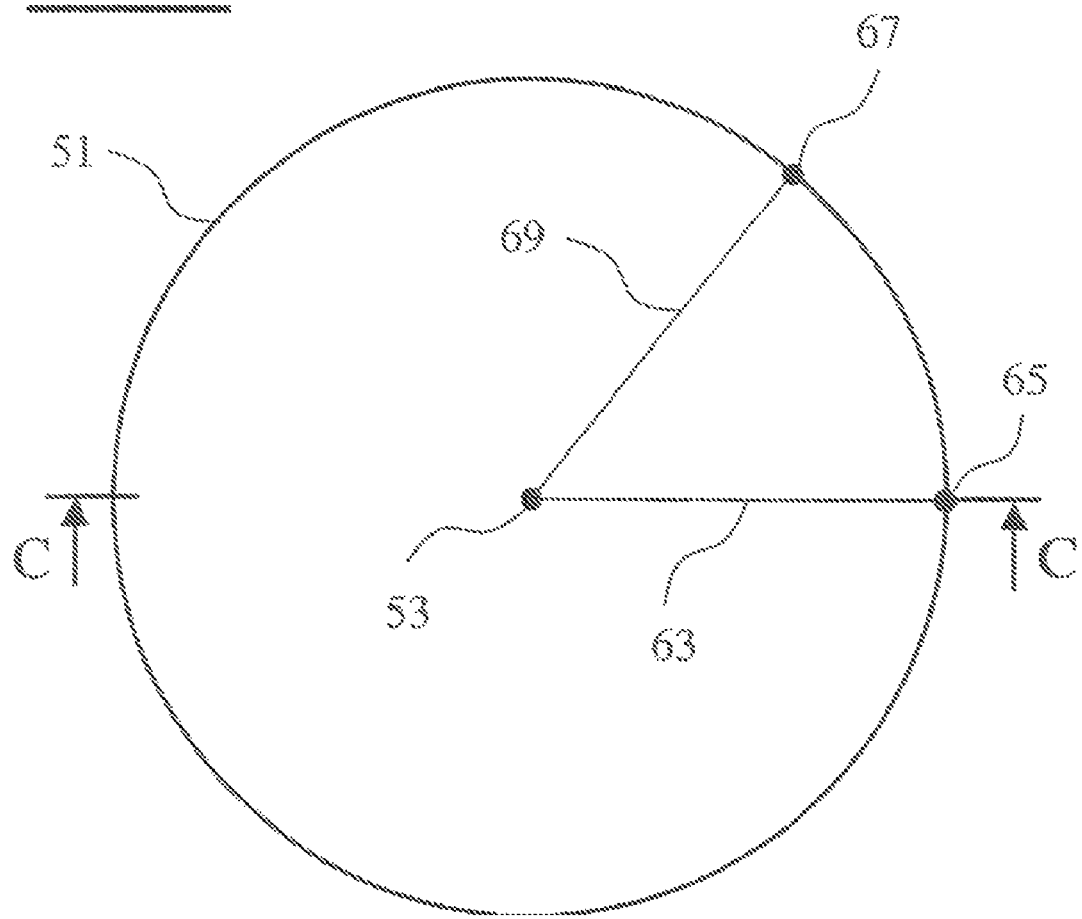
FIG. 6 schematically represents a plan view of the lens of FIG. 5.

FIGS. 5 and 6 schematically illustrate a lens 51 according as a further example that embodies the invention. FIG. 5 shows the lens in cross-section along the line C-C which is indicated in the plan view drawing of FIG. 6.

The calcium fluoride lens 51 in the example of FIGS. 5 and 6 is not a (111)-lens, but a (100)-lens. However, the lens axis 53 is not aligned exactly in the crystallographic <100>-direction 55; there is an angular deviation δ between the lens axis 53 and the crystallographic <100>-direction 55. The crystallographic <100>-direction 55 is perpendicular to the crystallographic {100}-planes 57.

In addition to the magnitude of the angle δ, it is also important to know the direction 63 of the angular deviation of the lens axis. The azimuthal direction 63 of the angular deviation is obtained as the projection of the crystallographic <100>-direction 55 into a plane that is perpendicular to the lens axis 53. The direction 63 of the angular deviation is preferably constituted by a radial line that intersects the lens axis 53. A marking 65 is applied to the lens 51 to indicate the direction 63 of the angular deviation. The marking can also be applied to a mounting device which is not illustrated in FIGS. 5 and 6. The marking shown in FIG. 6 is located at the intersection of the line representing the direction 63 with the cylindrical outside border of the lens 51.

The orientation of the crystallographic <100>-direction 55 in relation to the lens axis 53 can be determined by analyzing the respective Bragg reflexes of the crystallographic <100>-direction 55 for different rotated positions of the lens 51. To perform this process, the lens 51 is rotated about its lens axis 53. It is advantageous to determine the deviation in at least two rotated positions of the lens. In this example, the measurements are performed at 0° and 90°. To achieve an increased accuracy, additional measurements can be made at 180° and 270°.

As an alternative, the deviation of the lens axis 53 from the crystallographic <100>-direction 55 can also be determined by using the Laue method, in which case the incident test radiation is oriented in the direction of the lens axis.

In addition to the marking 65, the lens 51 also carries the marking 67. The marking 67 has a defined relationship to the crystallographic <511>-direction 59 which is perpendicular to the crystallographic {511}-planes 61. The marking is at the intersection of a radial line representing the reference direction 69 with the cylindrical outside border of the lens 51. The reference direction 69 is obtained as the projection of the crystallographic <511>-direction 59 into a plane that is perpendicular to the lens axis 53. The line that indicates the reference direction 69 intersects the lens axis 53. The reason for selecting the crystallographic <511>-direction 59 is that the projection of the <511>-direction 59 into a plane that is perpendicular to the lens axis 53 runs parallel to the projection of the crystallographic <011> direction into the same plane. The <011>-direction, in turn, is distinguished among other directions in the crystal, because the optical path difference for two mutually orthogonal states of polarization due to the intrinsic birefringence is maximal for a light ray traveling through the crystal in the crystallographic <011>-direction.

A single marking is sufficient for the purpose of setting the angle of rotation of a lens about its lens axis relative to a fixed reference direction of the objective. Since the lens 51 has the marking 67 for the reference direction 69, one could omit the additional marking 65 for the direction 63 of the lens axis deviation and determine instead the angle between the reference direction 69 and the direction 63 of the angular deviation of the lens axis as a characteristic value associated with each lens. For example, the value for the direction of the angular deviation could be stored together with the deviation angle in a database in which, e.g., the material- and production data of the lens 51 are stored. Thus, the angle as well as the direction of the lens axis deviation is available for the optimization procedures.

Figure 7:
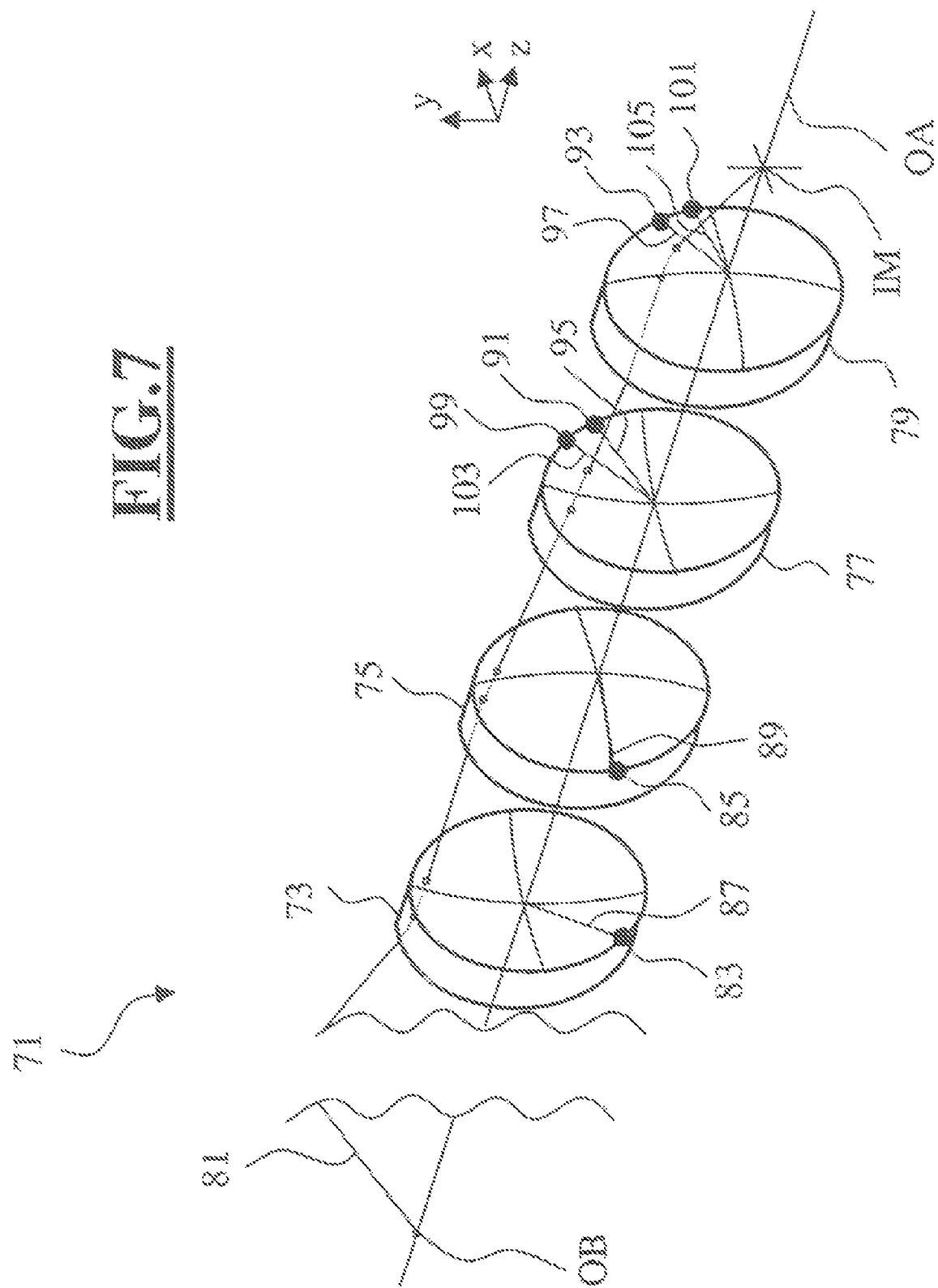
FIG. 7 schematically represents an objective in a perspective view.

FIG. 7 schematically illustrates a first embodiment of an objective 71 according to the invention. The objective produces an image IM of an object OB. Shown in the drawing are the lenses 73, 75, 77 and 79. The lens axes of the lenses 73, 75, 77 and 79 are aligned in the direction of the optical axis OA. The lenses 73, 75 are (111)-lenses and the lenses 77, 79 are (100)-lenses of calcium fluoride. To compensate for the detrimental influence of the intrinsic birefringence, the lenses are arranged with a rotation relative to each other about the lens axis so that the difference between the respective optical path differences for two orthogonal states of polarization in an outermost aperture ray 81 and a ray traveling along the optical axis OA is minimized. Meeting this condition requires an angle of rotation of 60° between the (111)-lenses 73 and 75. In accordance with the invention, setting the angle of rotation is a simple procedure, as the lenses 73 and 75 carry the markings 83 and 85 indicating the respective reference directions 87 and 89. The reference directions 87 and 89 represent the projections of the crystallographic <331>-directions of the lenses into planes that run perpendicular to the respective lens axes. The angle of rotation between the (100)-lenses 77 and 79 is not exactly 45°, because the crystallographic <100>-directions in these lenses are not aligned exactly in the directions of the respective lens axes. The respective directions 95 and 97 of the angular deviation of the lens axis are indicated by the markings 91 and 93. The magnitude and orientation of the lens axis deviation are taken into account in the optimization of the angle of rotation between the lenses 77 and 79. After calculating the optimal angle of rotation between the lenses 77 and 79, it is a simple procedure to set the lenses at the calculated angle with the help of the markings 99 and 101. The latter markings indicate the reference directions 103 and 105 which represent the projections of the crystallographic <511>-directions into planes that run perpendicular to the respective lens axes of the lenses 77 and 79.

A method of optimization will now be described which serves to determine on the one hand the lens axis orientation of the individual lenses in specific principal directions of the crystal structure and on the other hand the angles of rotation between the lenses in an objective of a known optical design. Several lenses of the objective consist of a birefringent fluoride crystal material, with the birefringent properties of the lenses representing likewise a known quantity, meaning for example that the influence of the intrinsic birefringence on a light ray can be theoretically predicted as a function of the aperture angle and the azimuth angle if the crystal material as well as its material orientation relative to the coordinate system of a lens are known. However, the birefringent properties may also be known from measurements that were made on the lenses. With the birefringent properties of the lenses and the optical design of the objective being known, the optical path difference for two mutually orthogonal states of linear polarization that occurs in a light ray inside the objective is likewise known. In the following process, the optical path difference occurring in a light ray represents the quantity that is to be optimized, meaning that its absolute value is to be minimized. Analogously, the optimization can also be extended to an entire bundle of individual light rays. Possible degrees of freedom that are available for this optimization are the angles of rotation of the individual lenses relative to each other and the orientation of the lens axes in relation to the principal crystallographic directions. In accordance with the principles described above, it is advantageous if on the one hand, the lens axes are oriented in the principal crystallographic directions and on the other hand, the angles of rotation relative to each other take on only certain discrete values that depend on the lens-axis orientation of the respective lens.

Three degrees of freedom are available for the orientation of the lens axis, i.e., the lens axes can be oriented in the (100)-, (111)- or (110)-direction of the crystallographic structure.

Lenses whose lens axes are oriented in the same principal crystallographic direction or in equivalent crystallographic directions are combined in individual groups, where each group has at least two lenses.

The discrete angles of rotation of the lenses of a group depend on the orientation of the lens axis.

If a group has a number n of (100)-lenses, the angles of rotation are to be specified as $$\gamma = \frac{90°}{n} + m \cdot 90° \pm 10°,$$

where m means an arbitrary integer. Accordingly, if the group is composed of two (100)-lenses, the angle of rotation between the two lenses is ideally 45° or 135°, 225° . . .

If a group has a number n of (111)-lenses, the angles of rotation are to be specified as $$\gamma = \frac{120°}{n} + m \cdot 120° \pm 10°,$$

where m means an arbitrary integer.

If a group has a number n of (110)-lenses, the angles of rotation are to be specified as $$\gamma = \frac{180°}{n} + m \cdot 180° \pm 10°,$$

where m means an arbitrary integer.

Thus, the discrete angles of rotation of the lenses relative to each other and the discrete crystallographic orientations of the lenses are available as degrees of freedom.

Within this parameter universe, one faces the task of finding the specific combination of angles of rotation and crystallographic orientations for the individual lenses where the optimization quantity takes on a minimum value, or finding a combination where the optimization quantity falls below a given threshold value.

For every objective, there is an optimal solution where the optical path differences for two mutually orthogonal states of linear polarization for an entire bundle of light rays take on minimal values.

Figure 8:
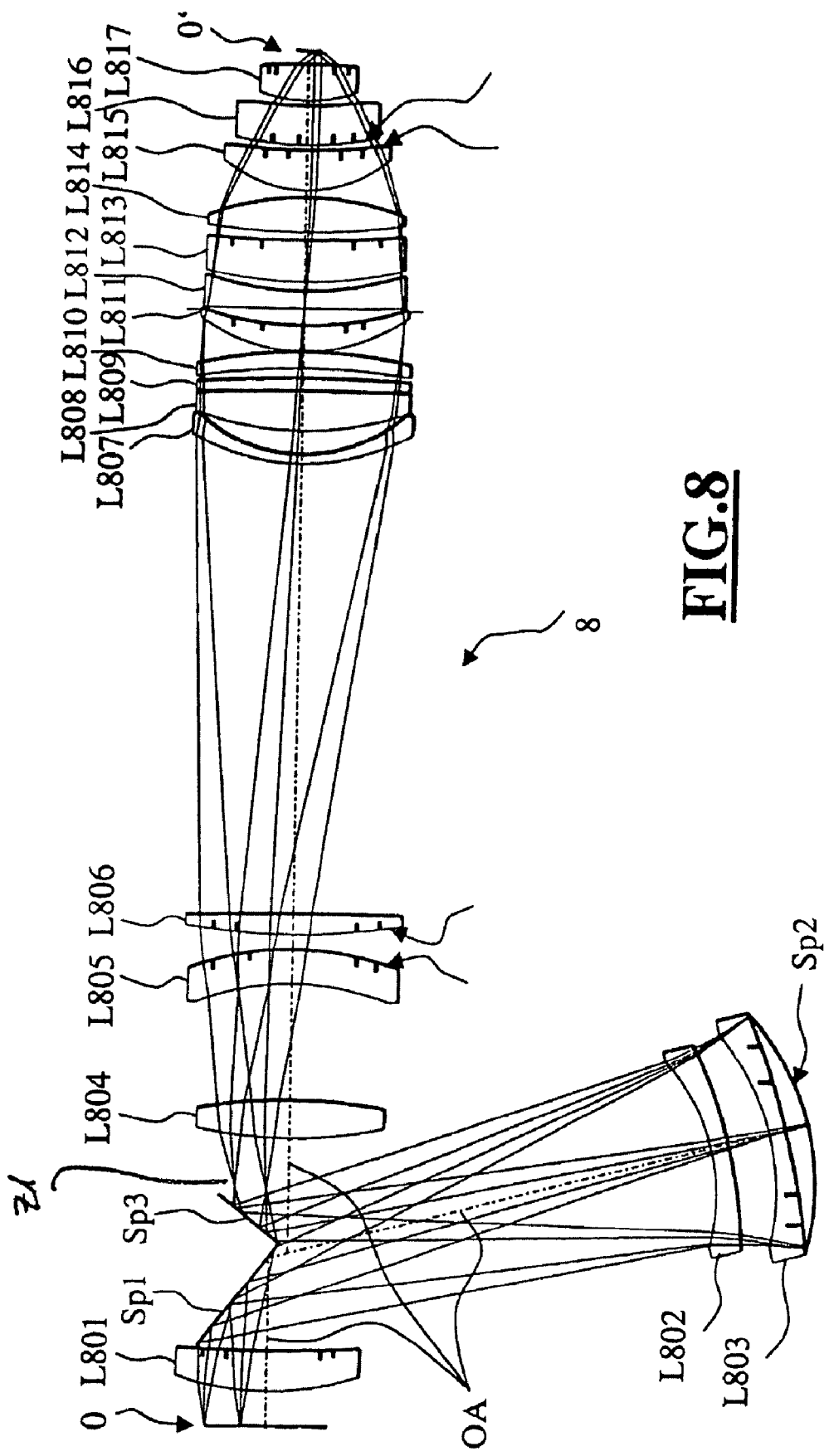
FIG. 8 represents a lens section of a projection objective.
Figure 9:
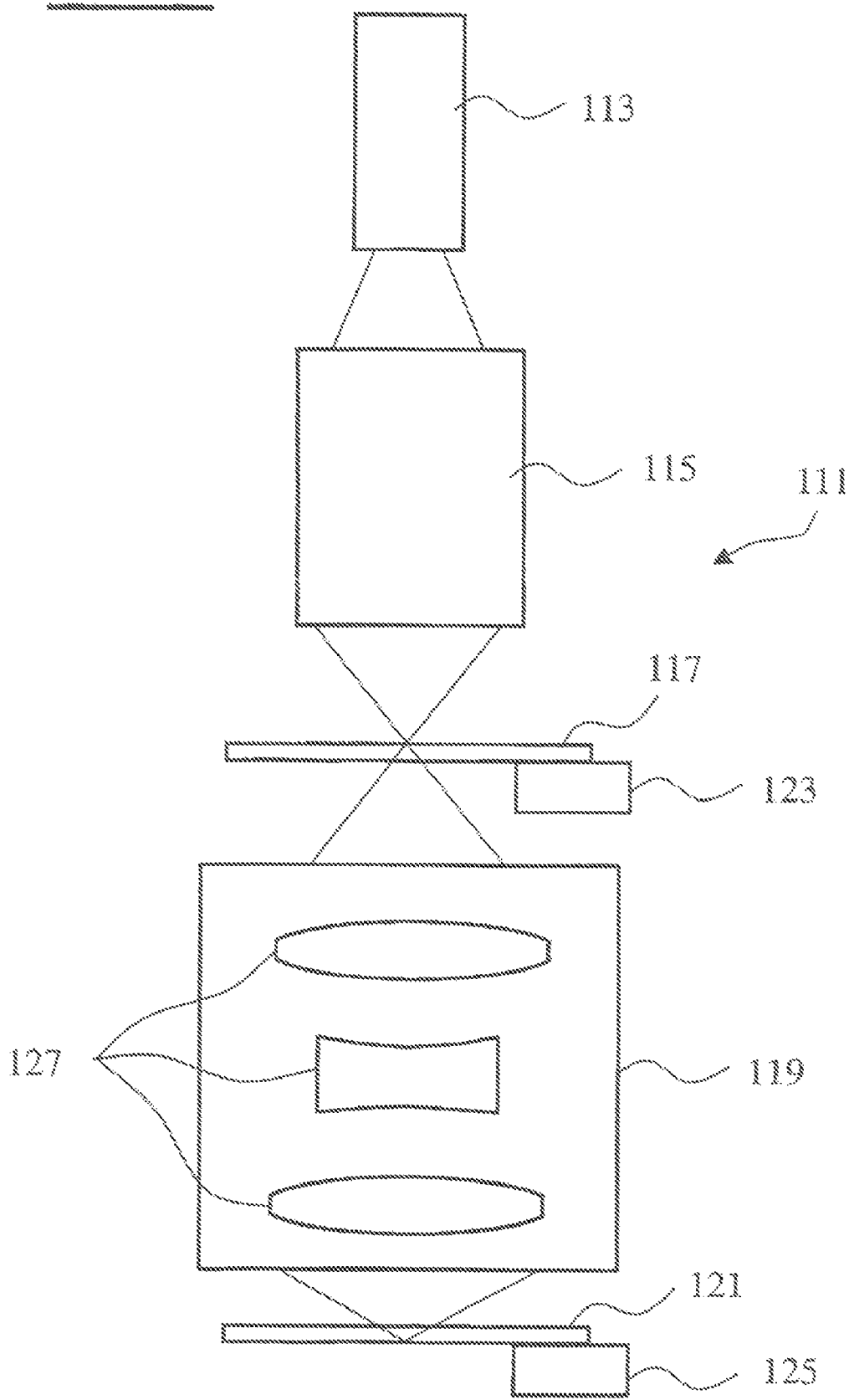
FIG. 9 schematically represents a projection system.

However, it is an extremely large undertaking to solve the problem of finding the true optimum, particularly if the objective has a large number of lenses, as is the case for the objective 8 of FIG. 8. FIG. 8 represents the lens section of a catadioptric projection objective 8 for the wavelength of 157 nm. The optical data for this objective are listed in Table 1. This example is borrowed from the patent application WO 01/50171 A1 (U.S. patent application Ser. No. 10/177,580), where the same objective is shown in FIG. 9 and specified in Table 8. For a detailed functional description of the objective, the reader is referred to the patent application WO 01/50171 A1 (U.S. patent application Ser. No. 10/177,580). All lenses of this objective consist of calcium fluoride crystal. The numerical aperture on the image side of the objective is 0.8.

There are optimization methods available that may not necessarily deliver the true optimum, but will at least lead to a solution that is adequate in view of the practical application that the objective is intended for. A closely related problem in the mathematical literature is known as "the problem of the traveling salesman" where the shortest possible route has to be found to visit a given set of cities on a geographical map.

The optimization may be accomplished by one of the following methods, which are known from the literature under the names:
1. Monte Carlo search,
2. Simulated annealing
3. Threshold accepting
4. Simulated annealing with intermediate reheating
5. Genetic algorithm In a first embodiment of the method outlined above for compensating the detrimental effect of intrinsic birefringence, there are four degrees of freedom (DOF) available for each lens:
DOF 1: (111)-lens with angle of rotation 0°
DOF 2: (111)-lens with angle of rotation 60°
DOF 3: (100)-lens with angle of rotation 0°
DOF 4: (100)-lens with angle of rotation 45°

The angles of rotation are defined in relation to a fixed reference direction in the object plane O.

In the case of the projection objective 8 of FIG. 8, the Monte Carlo search method was used with the four given degrees of freedom DOF1 to DOF4 to find the optimum combination of the crystallographic lens-axis orientations and of the angles of rotation $\beta_L$ of the lenses L801 to L817 relative to a fixed reference direction in the object plane O. The crystallographic orientations of the lens axes and the angles of rotation $\beta_L$ for the lenses L801 to L817 are listed in Table 2. Also shown for each lens is the optical path difference for two mutually orthogonal states of polarization for the highest and lowest outermost aperture rays. The two outermost aperture rays originate from an object point in the center of the object field, and their respective angles with the optical axis OA in the image plane O' correspond to the image-side numerical aperture. The maximum optical path difference for the objective as a whole is 5 nm.

TABLE 2

Lens data for the objective of FIG. 8

| Lens | Orientation of lens axis | Angle of rotation $\beta_L$ [°] | Optical path difference for the highest outermost aperture ray [nm] | Optical path difference for the lowest outermost aperture ray [nm] |
|---|---|---|---|---|
| L801 | <100> | 45 | 0.0 | −3.1 |
| L802 | <111> | 60 | −13.0 | 29.7 |
| L803 | <100> | 0 | −15.1 | −27.6 |
| L803 | <100> | 0 | −26.0 | −19.2 |
| L802 | <111> | 60 | 28.3 | −14.2 |
| L804 | <111> | 0 | −7.6 | 9.8 |
| L805 | <100> | 45 | −3.1 | −1.0 |
| L806 | <100> | 0 | 0.0 | −2.1 |
| L807 | <111> | 60 | −7.8 | 1.0 |
| L808 | <100> | 45 | 0.0 | −1.1 |
| L809 | <100> | 0 | 0.0 | −0.7 |
| L810 | <100> | 0 | −0.1 | −1.5 |
| L811 | <100> | 0 | −3.9 | −1.7 |
| L812 | <111> | 0 | 15.4 | −5.0 |
| L813 | <100> | 0 | −3.7 | −0.2 |
| L814 | <100> | 0 | −2.1 | −0.1 |
| L815 | <100> | 45 | −11.4 | −6.6 |
| L816 | <111> | 60 | −16.8 | 49.6 |
| L817 | <111> | 0 | 55.7 | −12.2 |
| sum | | | −5.0 | −2.7 |

Additional degrees of freedom for the optimization are obtained by assigning the lenses to individual groups. The lens axes of the lenses within a group are oriented in the same principal crystallographic direction. The lenses within a group are arranged with a rotation relative to each other, such that the resulting distribution of the optical path differences caused by the group for two mutually orthogonal states of linear polarization is close to rotational symmetry. The groups themselves can now be rotated at arbitrary angles to each other, which represent additional degrees of freedom that can be used to correct aberrations that may for example be due to the manufacturing process.

In the embodiment of Table 2, the lenses L801 and L814 are assigned to a first group of (100)-lenses. The two lenses are arranged with a 45° rotation relative to each other.

The lenses L802, L804, L807 and L812 are assigned to a second group with (111)-lenses and are divided into two subgroups, i.e., a subgroup with the lenses L802, L807 and another subgroup with the lenses L804, L812. The lenses of a subgroup are not rotated relative to each other, or at most they may be arranged at an angle of γ=l·120°±10°, where l represents an integer. The two subgroups are arranged with a rotation 60° relative to each other, so that the angle between two lenses of different subgroups is γ=60°+m·120°±10°, where m represents an integer.

The lenses L803, L805 and L815 are assigned to a third group with (100)-lenses and are divided into two subgroups, i.e., a subgroup with the lens L803 and another subgroup with the lenses L805, L815. The lenses of a subgroup are not rotated relative to each other, or at most they may be set at an angle of γ=1·90°±10°, where l represents an integer. The two subgroups are arranged with a rotation 45° relative to each other, so that the angle between two lenses of different subgroups is γ=45°+m·90°±10°, where m represents an integer.

The lenses L808, L809 and L811 are assigned to a fourth group with (100)-lenses and are divided into two subgroups, i.e., a subgroup with the lens L808 and another subgroup with the lenses L809, L811. The lenses of a subgroup are not rotated relative to each other, or at most they may be arranged at an angle of γ=1·90°±10°, where l represents an integer. The two subgroups are arranged with a rotation 45° relative to each other, so that the angle between two lenses of different subgroups is γ=45°+m·90°±10°, where m represents an integer.

The lenses L816 und L817 are assigned to a fifth group with (111)-lenses, where the two lenses are arranged with a rotation of 60° relative to each other.

In a second embodiment, there are eight degrees of freedom available for each lens:
DOF 1: (111)-lens with angle of rotation 0°
DOF 2: (111)-lens with angle of rotation 60°
DOF 3: (100)-lens with angle of rotation 0°
DOF 4: (100)-lens with angle of rotation 45°
DOF 5: (110)-lens with angle of rotation 0°
DOF 6: (110)-lens with angle of rotation 90°
DOF 7: (110)-lens with angle of rotation 45°
DOF 8: (110)-lens with angle of rotation 135°

The result of the optimization process improves with the number of degrees of freedom, but the volume of the task expands exponentially. Further degrees of freedom are available by using a smaller step size between the discrete angles of rotation.

Of course, the optimization can also be performed with angles of rotation that have a smaller step increment between the discrete values.

It is further possible to also consider measurement data related to stress-induced birefringence, surface shape data of the lenses or mirrors and/or inhomogeneities in the lens material. In this manner, all possible factors that interfere with the performance of the objective are taken into account, and the available degrees of freedom are used to find a parameter constellation for the objective which will result in a good overall image quality.

In particular, if the direction of the angular deviation of the lens axis is marked and if the magnitude as well as the orientation of the lens axis deviation from the respective principal crystallographic direction are known for every lens of the objective, it is possible to take the effects caused by the angular deviation into account in the optimization procedure. In lenses where the lens axes are oriented exactly in the crystallographic (100)-, (111)- or (110)-direction, there are always equivalent angles of rotation due to the symmetry of the crystallographic structure, such as for example γ=45°+m·90° for two (100)-lenses. If there is a deviation in the two lenses between the lens axis and the respective principal crystallographic direction, one can use the integer m as a degree of freedom in the optimization. The integer m can have one of the values 1, 2 and 3. Since the direction of the angular deviation as well as the reference direction is indicated by markings, the angle of rotation that is thus determined can be set exactly.

Following is a description of the individual steps of the optimization process:
As a first step, a target function is calculated for an objective in which the birefringent properties of the lenses are known. The target function represents a measure for the detrimental effect of the birefringence. For example, the optical path difference in an outermost aperture ray for two mutually orthogonal states of linear polarization can serve as a target function. Another possibility is to define the target function as the maximum or mean value of a distribution of optical path differences of a bundle of light rays. The angles of rotation and the crystallographic orientations as well as the value of the target function for the current parameter constellation of the objective are stored in memory. A threshold value is prescribed for the target function, meaning that the detrimental effect of the birefringence is tolerable if the target function falls below the threshold.

As a second step, the target function is evaluated as to whether it falls below the threshold value. If the target function is found below the threshold value, the process is terminated. If the target function fails to meet the threshold criterion, the process continues with step three.

In the third step, the angles of rotation of the lenses relative to each other and the crystallographic orientations of the lenses are changed in the objective within the constraints of the given degrees of freedom, using one of the aforementioned methods, for example the Monte Carlo method.

Following the third step, the process loops back to step one, keeping count of the number of loops completed. If the number of loops exceeds a given maximum limit, the process is likewise terminated.

According to this cycle of steps, the process is terminated if either the target function falls below a given threshold or a maximum number of loops has been exceeded. If the maximum number of loops is exceeded, the result could be presented, e.g., in the form of a ranking list for the parameter constellations that were tried out and the values of the target function that were found for each constellation.

FIG. 9 illustrates in principle the arrangement of a microlithography projection system. The projection system 111 has a light source 113, an illumination device 115, a structure-carrying mask 117, a projection objective 119, and a substrate 121 that is exposed to the projection. The illumination device 115 collects the light of the light source 113, for example a KrF- or ArF laser, depending on the operating wavelength, and illuminates the mask 117. In conformance with the requirements of the exposure process, the illumination provides a specified degree of homogeneity of the light distribution at the mask and a specified illumination of the entry pupil of the objective 119. The mask 117 is held in the light path by means of a mask holder 123. The mask 117 is of a type used in microlithography applications, carrying a structure with details in the micrometer to nanometer range. As an alternative to a so-called reticle, the structure-carrying mask can also be constituted by a controllable micro-mirror array or a programmable LCD array. The projection objective 119 forms an image of the mask 117, or in some cases of a part of the mask 117, on the substrate 121 that is held in position by a substrate holder 125. The projection objective 119 is for example the catadioptric objective represented in FIG. 8. The individual lenses 127 of the projection objective are arranged with a rotation relative to each other in order to minimize the detrimental influence of birefringence or other phenomena. With the markings according to the invention, the setting of the angle of rotation of the lenses is a simple procedure. The substrate 121 is typically a silicon wafer carrying a light-sensitive coating, the so-called resist. In further steps, the exposed substrates are subsequently processed into semiconductor components.

TABLE 1

| L61 LENS | RADII | THICKNESSES | MATERIAL | REFRACTIVE INDEX AT 157.629 nm | ½ FREE DIAMETER |
|---|---|---|---|---|---|
| 0 | 0.000000000 | 34.000000000 | | 1.00000000 | 82.150 |
| | 0.000000000 | 0.100000000 | | 1.00000000 | 87.654 |
| L801 | 276.724757380 | 40.000000000 | CaF2 | 1.55970990 | 90.112 |
| | 1413.944109416AS | 95.000000000 | | 1.00000000 | 89.442 |
| SP1 | 0.000000000 | 11.000000000 | | 1.00000000 | 90.034 |
| | 0.000000000 | 433.237005445 | | 1.00000000 | 90.104 |
| L802 | −195.924336384 | 17.295305525 | CaF2 | 1.55970990 | 92.746 |
| | −467.658808527 | 40.841112468 | | 1.00000000 | 98.732 |
| L803 | −241.385736441 | 15.977235467 | CaF2 | 1.55970990 | 105.512 |
| | −857.211727400AS | 21.649331094 | | 1.00000000 | 118.786 |
| SP2 | 0.000000000 | 0.000010000 | | 1.00000000 | 139.325 |
| | 253.074839896 | 21.649331094 | | 1.00000000 | 119.350 |
| L803' | 857.211727400AS | 15.977235467 | CaF2 | 1.55970990 | 118.986 |
| | 241.385736441 | 40.841112468 | | 1.00000000 | 108.546 |
| L802' | 467.658808527 | 17.295305525 | CaF2 | 1.55970990 | 102.615 |
| | 195.924336384 | 419.981357165 | | 1.00000000 | 95.689 |
| SP3 | 0.000000000 | 6.255658280 | | 1.00000000 | 76.370 |
| | 0.000000000 | 42.609155219 | | 1.00000000 | 76.064 |
| Z1 | 0.000000000 | 67.449547115 | | 1.00000000 | 73.981 |
| L804 | 432.544479547 | 37.784311058 | CaF2 | 1.55970990 | 90.274 |
| | −522.188532471 | 113.756133662 | | 1.00000000 | 92.507 |
| L805 | −263.167605725 | 33.768525968 | CaF2 | 1.55970990 | 100.053 |
| | −291.940616829AS | 14.536591424 | | 1.00000000 | 106.516 |
| L806 | 589.642961222AS | 20.449887046 | CaF2 | 1.55970990 | 110.482 |
| | −5539.698828792 | 443.944079795 | | 1.00000000 | 110.523 |
| L807 | 221.780582003 | 9.000000000 | CaF2 | 1.55970990 | 108.311 |
| | 153.071443064 | 22.790060084 | | 1.00000000 | 104.062 |
| L808 | 309.446967518 | 38.542735318 | CaF2 | 1.55970990 | 104.062 |
| | −2660.227900099 | 0.100022286 | | 1.00000000 | 104.098 |
| L809 | 23655.354584194 | 12.899131182 | CaF2 | 1.55970990 | 104.054 |
| | −1473.189213176 | 9.318886362 | | 1.00000000 | 103.931 |
| L810 | −652.136459374 | 16.359499814 | CaF2 | 1.55970990 | 103.644 |
| | −446.489459129 | 0.100000000 | | 1.00000000 | 103.877 |
| L811 | 174.593507050 | 25.900313780 | CaF2 | 1.55970990 | 99.267 |
| | 392.239615259AS | 14.064505431 | | 1.00000000 | 96.610 |
| | 0.000000000 | 2.045119392 | | 1.00000000 | 96.552 |
| L812 | 7497.306838492 | 16.759051656 | CaF2 | 1.55970990 | 96.383 |
| | 318.210831711 | 8.891640764 | | 1.00000000 | 94.998 |
| L813 | 428.724465129 | 41.295806263 | CaF2 | 1.55970990 | 95.548 |
| | 3290.097860119AS | 7.377912006 | | 1.00000000 | 95.040 |
| L814 | 721.012739719 | 33.927118706 | CaF2 | 1.55970990 | 95.443 |
| | −272.650872353 | 6.871397517 | | 1.00000000 | 95.207 |
| L815 | 131.257556743 | 38.826450065 | CaF2 | 1.55970990 | 81.345 |
| | 632.112566477AS | 4.409527396 | | 1.00000000 | 74.847 |
| L816 | 342.127616157AS | 37.346293509 | CaF2 | 1.55970990 | 70.394 |
| | 449.261078744 | 4.859754445 | | 1.00000000 | 54.895 |
| L817 | 144.034814702 | 34.792179308 | CaF2 | 1.55970990 | 48.040 |
| | −751.263321098AS | 11.999872684 | | 1.00000000 | 33.475 |
| 0' | 0.000000000 | 0.000127776 | | 1.00000000 | 16.430 |

ASPHERICAL CONSTANTS

| Asphere of lens L801 | | Asphere of lens L803 | | Asphere of lens L803' | | Asphere of lens L805 | |
|---|---|---|---|---|---|---|---|
| K | 0.0000 | K | 0.0000 | K | 0.0000 | K | 0.0000 |
| C1 | 4.90231706e−009 | C1 | −5.33460884e−009 | C1 | 5.33460884e−009 | C1 | 2.42569449e−009 |
| C2 | 3.08634889e−014 | C2 | 9.73867225e−014 | C2 | −9.73867225e−014 | C2 | 3.96137865e−014 |
| C3 | −9.53005325e−019 | C3 | −3.28422058e−018 | C3 | 3.28422058e−018 | C3 | −2.47855149e−018 |
| C4 | −6.06316421e−024 | C4 | 1.50550421e−022 | C4 | −1.50550421e−022 | C4 | 7.95092779e−023 |
| C5 | 6.11462814e−028 | C5 | 0.00000000e+000 | C5 | 0.00000000e+000 | C5 | 0.00000000e+000 |
| C6 | −8.64346302e−032 | C6 | 0.00000000e+000 | C6 | 0.00000000e+000 | C6 | 0.00000000e+000 |
| C7 | 0.00000000e+000 | C7 | 0.00000000e+000 | C7 | 0.00000000e+000 | C7 | 0.00000000e+000 |
| C8 | 0.00000000e+000 | C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 | C9 | 0.00000000e+000 |

| Asphere of lens L806 | | Asphere of lens L811 | | Asphere of lens L813 | | Asphere of lens L815 | |
|---|---|---|---|---|---|---|---|
| K | 0.0000 | K | 0.0000 | K | 0.0000 | K | 0.0000 |
| C1 | −6.74111232e−009 | C1 | 2.28889624e−008 | C1 | 3.40212872e−008 | C1 | −3.15395039e−008 |
| C2 | −2.57289693e−014 | C2 | −1.88390559e−014 | C2 | −1.08008877e−012 | C2 | 4.30010133e−012 |
| C3 | −2.81309020e−018 | C3 | 2.86010656e−017 | C3 | 4.33814531e−017 | C3 | 3.11663337e−016 |
| C4 | 6.70057831e−023 | C4 | −3.18575336e−021 | C4 | −7.40125614e−021 | C4 | −3.64089769e−020 |
| C5 | 5.06272344e−028 | C5 | 1.45886017e−025 | C5 | 5.66856812e−025 | C5 | 1.06073268e−024 |
| C6 | −4.81282974e−032 | C6 | −1.08492931e−029 | C6 | 0.00000000e+000 | C6 | 0.00000000e+000 |
| C7 | 0.00000000e+000 | C7 | 0.00000000e+000 | C7 | 0.00000000e+000 | C7 | 0.00000000e+000 |
| C8 | 0.00000000e+000 | C8 | 0.00000000e+000 | C8 | 0.00000000e+000 | C8 | 0.00000000e+000 |

TABLE 1-continued

| | | | | | | | |
|---|---|---|---|---|---|---|---|
| C9 | 0.00000000e+000 | C9 | 0.00000000e+000 | C9 | 0.00000000e+000 | C9 | 0.00000000e+000 |

| | Asphere of lens L816 | | Asphere of lens L817 | |
|---|---|---|---|---|
| | K | 0.0000 | K | 0.0000 |
| | C1 | −2.16574623e−008 | C1 | 2.15121397e−008 |
| | C2 | −6.67182801e−013 | C2 | −1.65301726e−011 |
| | C3 | 4.46519932e−016 | C3 | −5.03883747e−015 |
| | C4 | −3.71571535e−020 | C4 | 1.03441815e−017 |
| | C5 | 0.00000000e+000 | C5 | −6.29122773e−021 |
| | C6 | 0.00000000e+000 | C6 | 1.44097714e−024 |
| | C7 | 0.00000000e+000 | C7 | 0.00000000e+000 |
| | C8 | 0.00000000e+000 | C8 | 0.00000000e+000 |
| | C9 | 0.00000000e+000 | C9 | 0.00000000e+000 |

What is claimed is:

1. A method of manufacturing an optical blank from a crystal material as a preliminary stage in manufacturing a lens for an objective, wherein the crystal material has a crystallographic structure, and wherein the term lens means a lens as well as a lens part, said method comprising the steps of
   a) determining an orientation of a first crystallographic direction that is defined in relation to said crystallographic structure;
   b) machining the crystal material into an optical blank so that the first crystallographic direction is substantially perpendicular to an optical blank surface of the optical blank;
   c) applying a marking to one of the optical blank and a mounting element of the optical blank, wherein the marking has a defined relationship to a second crystallographic direction which is oriented at a non-zero angle relative to the first crystallographic direction.

2. The method of claim 1, wherein the marking indicates a reference direction that is perpendicular to the first crystallographic direction, and wherein said reference direction is obtained as a projection of the second crystallographic direction into a plane that runs perpendicular to the first crystallographic direction.

3. The method of claim 2, wherein the step of determining the reference direction is performed by measuring a direction of a Bragg reflex of a series of second crystallographic planes associated with the second crystallographic direction.

4. The method of claim 3, further comprising the step of removing those material portions of the optical blank that were traversed by a Bragg test radiation.

5. The method of claim 2, wherein the step of determining the reference direction is performed by a method that is known as Laue method.

6. The method of claim 2, wherein a light ray is subject to one of a maximum optical path difference and a minimum optical path difference for two mutually orthogonal states of linear polarization if a projection of said light ray into a plane that is perpendicular to the first crystallographic direction is parallel to the reference direction.

7. The method of claim 1, wherein determining the orientation of the first crystallographic direction comprises measuring a direction of a Bragg reflex of a series of first crystallographic planes associated with the first crystallographic direction.

8. The method of claim 7, wherein the step of measuring the direction of the Bragg reflex is performed at a plurality of measurement positions of the optical blank, said measurement positions being rotated positions in relation to each other about an axis that extends perpendicular to said optical blank surface, and wherein the orientation of the first crystallographic direction is determined by comparing results obtained at said plurality of measurement positions.

9. The method of claim 7, further comprising the step of removing those material portions of the optical blank that were traversed by a Bragg test radiation.

10. The method of claim 1, wherein the crystallographic structure comprises a crystallographic <100>-direction, <100>-equivalent directions, a crystallographic <111>-direction, <111>-equivalent directions, a crystallographic <110>-direction, and <110>-equivalent directions.

11. The method of claim 10, wherein the first crystallographic direction coincides with one of the directions from the group that consists of the crystallographic <100>-direction, the <100>-equivalent directions, the crystallographic <111>-direction, the <111>-equivalent directions, the crystallographic <110>-direction, and the <110>-equivalent directions.

12. The method of claim 10, wherein the first crystallographic direction is one of the directions from the group that consists of the crystallographic <100>-direction, the <100>-equivalent directions, the crystallographic <111>-direction, and the <111>-equivalent directions, and wherein a projection of the second crystallographic direction into a plane that runs perpendicular to the first crystallographic direction is parallel to the projection of the crystallographic <110>-direction or one of the <110>-equivalent directions into a plane that runs perpendicular to the first crystallographic direction.

13. The method of claim 10, wherein the crystallographic structure further comprises a crystallographic <331>-direction and <331>-equivalent directions, wherein the first crystallographic direction coincides with one of the directions from the group that consists of the crystallographic <111>-direction and the <111>-equivalent directions, and wherein the second crystallographic direction coincides with one of the directions from the group that consists of the crystallographic <331>-direction and the <331>-equivalent directions.

14. The method of claim 10, wherein the crystallographic structure further comprises a crystallographic <511>-direction and <511>-equivalent directions, wherein the first crystallographic direction coincides with one of the directions from the group that consists of the crystallographic <100>-direction and the <100>-equivalent directions, and wherein the second crystallographic direction coincides with one of the directions from the group that consists of the crystallographic <511>-direction and the <511>-equivalent directions.

15. The method of claim 1, wherein the crystal material comprises one of calcium fluoride, strontium fluoride, and barium fluoride.

16. The optical blank made according to the method of claim 1.

17. An optical blank made from a crystal material and used as an initial product stage in manufacturing a lens for an objective, wherein the term lens means a lens as well as a lens part, wherein the optical blank comprises an optical blank surface extending substantially perpendicular to a first crystallographic direction, wherein the optical blank further comprises a marking, said marking being affixed to one of the optical blank and a mounting element of the optical blank, and wherein the marking has a defined relationship to a second crystallographic direction which is oriented at a non-zero angle relative to the first crystallographic direction.

18. The optical blank of claim 17, wherein the marking indicates a reference direction that is perpendicular to the first crystallographic direction, and wherein said reference direction is obtained as a projection of the second crystallographic direction into a plane that runs perpendicular to the first crystallographic direction.

19. A method of making a lens from the optical blank of claim 17, wherein the lens has a lens axis, and wherein the method comprises the step of:
  d) shaping the lens in such a way that the lens axis is substantially parallel to the first crystallographic direction.

20. The method of claim 19, further comprising the steps:
  e) determining an angular deviation between the lens axis and the first crystallographic direction;
  f) determining a direction of the angular deviation, said direction of the angular deviation being perpendicular to the lens axis and being obtained by projecting the first crystallographic direction into a plane that extends perpendicular to the lens axis;
  and also comprising at least one of the steps g1) and g2), wherein
  g1) comprises marking the direction of the angular deviation on one of the lens and a mounting element of the lens; and
  g2) comprises determining a direction angle between the reference direction and the direction of the angular deviation and assigning said direction angle to the lens.

* * * * *

UNITED STATES PATENT AND TRADEMARK OFFICE
CERTIFICATE OF CORRECTION

PATENT NO. : 7,672,044 B2  Page 1 of 1
APPLICATION NO. : 11/864193
DATED : March 2, 2010
INVENTOR(S) : Birgit Enkisch It is certified that error appears in the above-identified patent and that said Letters Patent is hereby corrected as shown below:

Title Page, Item (75), Column 1, Line 3, delete "Aalen-Hofen (GB)" insert --Aalen-Hofen (DE)--.

Title Page, Item (56) Ref Cited, Page 2, Column 2, Line 12, delete "Nicht-Vertrauliches" insert --Nicht-Vertfrulicher--.

Column 17, Line 15, delete "und" insert --and--.

Column 21, Line 22, Claim 1, after "of" insert --:--.

Signed and Sealed this

Twenty-fifth Day of May, 2010

David J. Kappos
*Director of the United States Patent and Trademark Office*